United States Patent
Lee et al.

(10) Patent No.: US 12,075,709 B2
(45) Date of Patent: Aug. 27, 2024

(54) TUNGSTEN VIA FOR A MAGNETIC TUNNEL JUNCTION INTERCONNECT

(71) Applicant: Taiwan Semiconductor Manufacturing Company, Ltd., Hsinchu (TW)

(72) Inventors: Ya-Ling Lee, Hsinchu (TW); Wei-Gang Chiu, New Taipei (TW); Ming-Hsing Tsai, Chu-Pei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 370 days.

(21) Appl. No.: 17/377,753

(22) Filed: Jul. 16, 2021

(65) Prior Publication Data
US 2023/0016126 A1     Jan. 19, 2023

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ......... H10N 50/80; H10N 50/01; H10B 61/00
USPC ....................................................... 257/427
See application file for complete search history.

(56) References Cited

U.S. PATENT DOCUMENTS

| | | | |
|---|---|---|---|
| 10,727,276 B1* | 7/2020 | Lien | H10N 50/80 |
| 10,811,595 B2 | 10/2020 | Lee et al. | |
| 11,101,429 B2 | 8/2021 | Peng et al. | |
| 2013/0242500 A1* | 9/2013 | Lin | H01L 24/48 |
| | | | 361/679.32 |
| 2018/0158728 A1 | 6/2018 | Chu et al. | |
| 2020/0035907 A1* | 1/2020 | Peng | H10N 50/01 |
| 2021/0091306 A1* | 3/2021 | Dutta | H10N 50/01 |
| 2021/0118867 A1* | 4/2021 | Chen | H10B 43/10 |
| 2021/0367143 A1* | 11/2021 | Lee | H10N 50/01 |
| 2022/0020920 A1* | 1/2022 | Chen | H10B 61/00 |
| 2022/0285434 A1* | 9/2022 | Shen | H01L 25/50 |
| 2022/0285436 A1* | 9/2022 | Shen | H10N 50/01 |
| 2022/0336732 A1* | 10/2022 | Yang | H10N 50/01 |
| 2023/0016126 A1* | 1/2023 | Lee | H10N 50/80 |
| 2023/0281372 A1* | 9/2023 | Tung | G06F 30/392 |
| | | | 716/100 |
| 2023/0420565 A1* | 12/2023 | Su | H01L 29/16 |

FOREIGN PATENT DOCUMENTS

| | | |
|---|---|---|
| CN | 108701756 A | 10/2018 |
| TW | 202016993 A | 5/2020 |

* cited by examiner

*Primary Examiner* — Jami Valentine Miller
(74) *Attorney, Agent, or Firm* — Harrity & Harrity, LLP

(57) ABSTRACT

One or more semiconductor processing tools may deposit one or more tantalum nitride layers on an upper surface of a copper interconnect and within a via. The one or more semiconductor processing tools may deposit an adhesion layer on an upper surface of the one or more tantalum nitride layers and within the via. The one or more semiconductor processing tools may deposit tungsten on an upper surface of the adhesion layer and within the via for via interconnection of the magnetic tunnel junction to the copper interconnect.

20 Claims, 17 Drawing Sheets

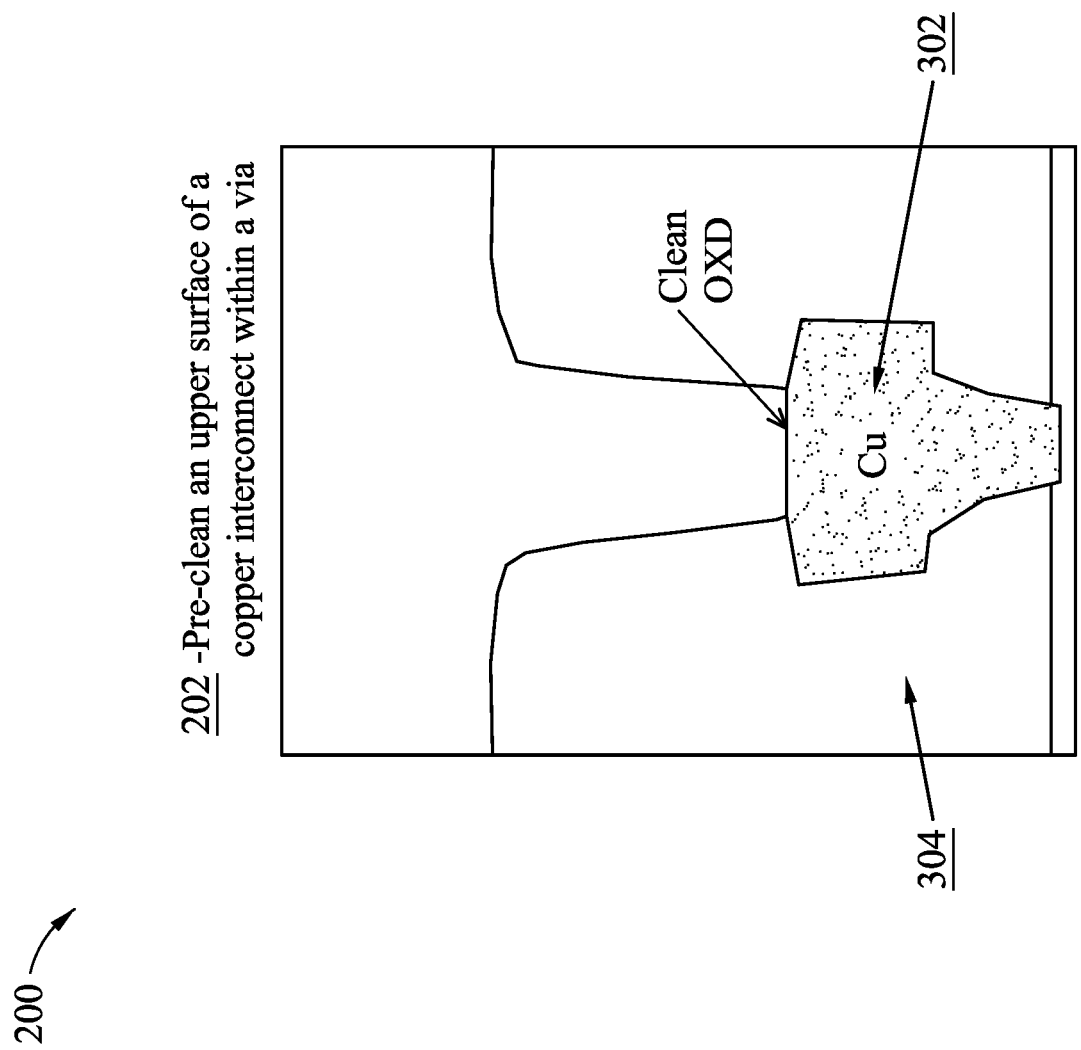

TUNGSTEN VIA FOR A MAGNETIC TUNNEL JUNCTION INTERCONNECT

BACKGROUND

Back end of line (BEOL) is a region of integrated circuit (IC) fabrication where individual devices (e.g., transistors, capacitors, resistors, and/or the like) are interconnected with wiring (e.g., a metallization layer) on a semiconductor wafer. Common metals utilized in BEOL processes include copper and aluminum. BEOL generally begins when a first layer of metal is deposited on the semiconductor wafer. BEOL includes contacts, insulating layers (e.g., dielectric layers, passivation layers, and/or the like), metal levels, bonding sites, and/or the like for chip-to-package connections.

Magnetoresistive random-access memory (MRAM) is a type of non-volatile random-access memory (RAM) that stores data using a magnetic tunnel junction (MTJ). An MTJ includes two magnetic layers separated by an insulating layer. The insulating layer is sufficiently thin to permit electrons to tunnel through the insulating layer if a bias voltage is applied between the two magnetic layers. A tunneling current is based on a relative magnetic orientation between the two magnetic layers, and dictates whether a 1-value or a 0-value is read from the MRAM. Thus, the value stored by the MRAM may be set by changing a magnetic orientation of a first magnetic layer relative to a magnetic orientation of a second magnetic layer.

The bias voltage may be applied across the magnetic layers by an associated transistor. The transistor may be formed in a front end of line (FEOL) region, whereas the MTJ may be formed in a BEOL region. A top magnetic layer of the MRAM may connect to a copper bit line, and a via may connect a bottom magnetic layer of the MRAM to a copper interconnect that connects to the transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2K are diagrams of one or more example implementations described herein.

DETAILED DESCRIPTION

Figure 1:
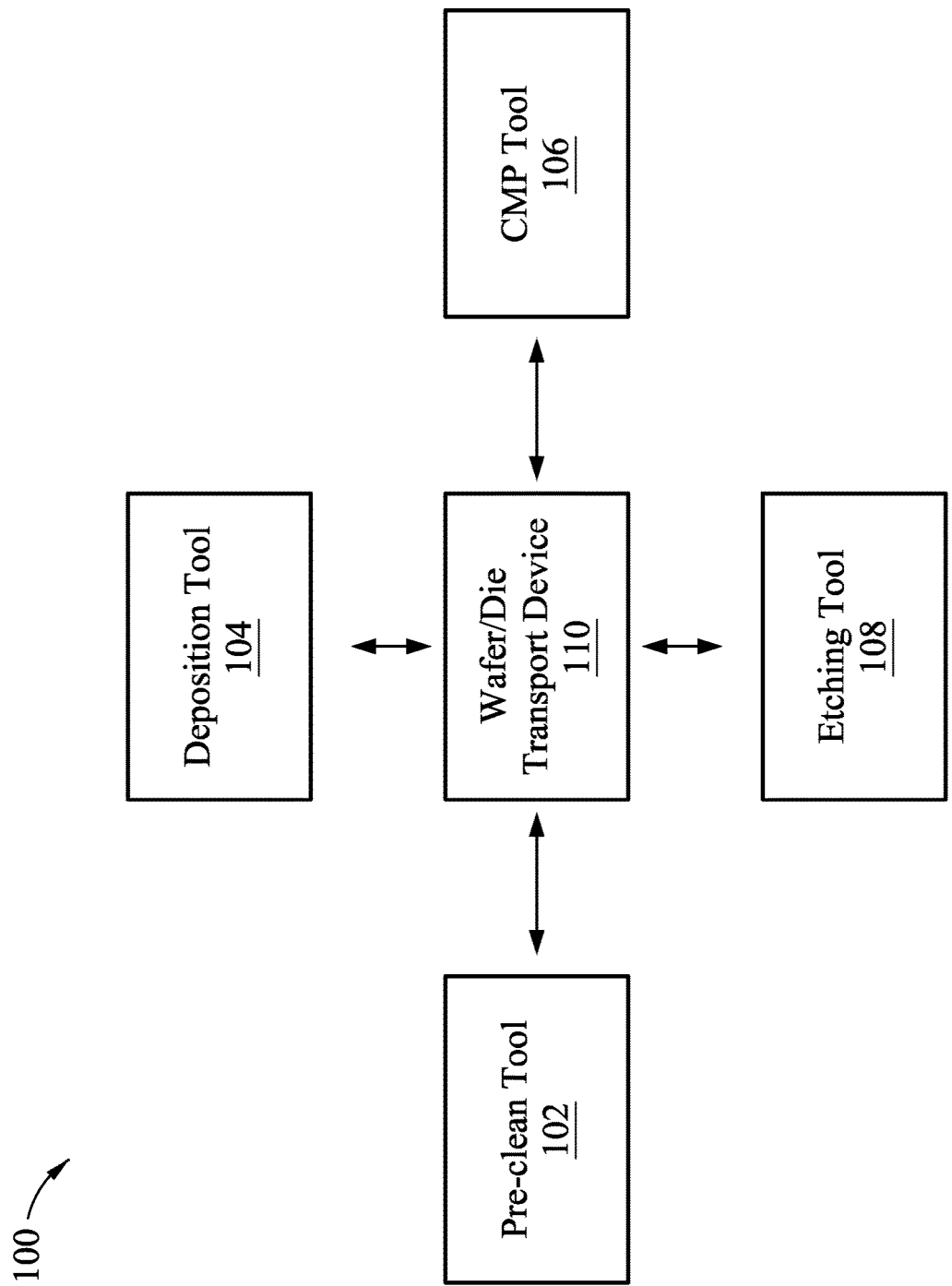
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bottom magnetic layer of an MRAM may connect to a copper interconnect of a transistor using a via. In some cases, the via may be filled with copper to provide low resistivity (e.g., electrical resistivity) between the bottom magnetic layer and the copper interconnect of the transistor. However, copper is subject to high electromigration and may diffuse into an insulating layer of an MTJ of the MRAM. This may decrease performance of, and/or damage, the MTJ.

Some implementations described herein provide techniques and apparatuses for using a tungsten metal to fill a via (a "tungsten via") between a lower magnetic layer of an MTJ and a copper interconnect of an associated transistor. Moreover, additional films may be used in the via with the tungsten metal to prevent fluorine corrosion, to prevent tungsten peeling, to provide a copper defusal barrier (i.e., to prevent copper from the copper interconnect from migrating upward to the via), and/or the like.

An example tungsten via may include one or more tantalum nitride layers disposed on an upper surface of a copper interconnect. The one or more tantalum nitride layers may reduce or prevent copper diffusion of the copper interconnect. An adhesion layer (e.g., titanium nitride) may be disposed on an upper surface of the one or more tantalum nitride layers. The adhesion layer may reduce or prevent tungsten peeling. Tungsten metal may be disposed on an upper surface of the adhesion layer for via interconnection of an MTJ to the copper interconnect.

Using tungsten in the via between a lower magnetic layer of the MTJ of the copper interconnect (e.g., leading to a transistor) provides lower resistivity compared with using titanium nitride in the via. Moreover, the one or more tantalum nitride layers may reduce or prevent copper and tungsten intermixing, reduce copper electromigration into an isolating layer of the MTJ, reduce or prevent fluorine from diffusing into the copper interconnect (which could cause copper corrosion), reduce stress on the tungsten, and/or the like. The adhesion layer may promote adhesion of the tungsten layer to reduce peeling of the tungsten.

FIG. 1 is a diagram of an example environment 100 in which systems and/or methods described herein may be implemented. As shown in FIG. 1, environment 100 may include a plurality of semiconductor processing tools 102-108 and a wafer/die transport device 110. The plurality of semiconductor processing tools 102-108 may include a pre-clean tool 102, a deposition tool 104, a chemical-mechanical polishing (CMP) tool 106, an etching tool 108, and/or other the like. The semiconductor processing tools included in example environment 100 may be included in a semiconductor clean room, a semiconductor foundry, a semiconductor processing and/or manufacturing facility, and/or the like.

Pre-clean tool 102 may include a pre-clean chamber and/or one or more devices capable of performing a pre-clean process on a semiconductor device to remove an oxide layer (e.g., a metal oxide layer) from the semiconductor device. The one or more devices may include a gas source, a plasma source, a heat source, and/or the like. The gas source may supply various gasses to pre-clean chamber, such as a hydrogen gas. The plasma source may generate a plasma that causes a reaction between the gasses supplied to the pre-clean chamber. For example, the plasma source includes an inductively coupled plasma source, a transformer coupled plasma source, or another type of plasma source capable of causing a reaction between an ammonia gas and a nitrogen trifluoride gas to cause the formation of an ammonium fluoride gas. The heat source may be capable of heating a semiconductor device in the pre-clean chamber to cause one or more layers on the semiconductor device to decompose, as described herein. For example, the heat source may include a heat lamp, a heating coil, or another type of heating device that heats the semiconductor device to cause a protection layer on the semiconductor device to decompose into an ammonia gas and a hydrogen fluoride gas.

Deposition tool 104 is a semiconductor processing tool that includes a semiconductor processing chamber and one or more devices capable of depositing various types of materials onto a semiconductor device. For example, deposition tool 104 may include a chemical vapor deposition device (e.g., an electrostatic spray device, an epitaxy device, and/or another type of chemical vapor deposition device), a physical vapor deposition (PVD) device (e.g., a sputtering device and/or another type of physical vapor deposition device), an atomic layer deposition (ALD) device, and/or the like. In some implementations, deposition tool 104 may deposit a metal layer onto a source region or a drain region of a semiconductor device, may deposit a contact material to form a contact (e.g., a self-aligned contact) of a semiconductor device, and/or the like as described herein.

CMP tool 106 is a semiconductor processing tool that includes one or more device capable of polishing or planarizing various layers of a wafer or semiconductor device. In some implementations, CMP tool 106 may polish or planarize a layer of deposited or plated material.

Etching tool 108 is a semiconductor processing tool that includes one or more devices capable of etching (e.g., removing) material from a surface of a wafer or a semiconductor device. For example, etching tool 108 may include a wet etching device, a dry etching device, a laser etching device, a chemical etching device, a plasma etching device, a reactive ion etching device, a sputter etching device, a vapor phase etching device, and/or the like. In some implementations, etching tool 108 may remove a layer from a semiconductor device as described herein.

Wafer/die transport device 110 includes a mobile robot, a robot arm, a tram or rail car, and/or another type of device that are used to transport wafers and/or dies between semiconductor processing devices 102-108 and/or to and from other locations such as a wafer rack, a storage room, and/or the like. In some implementations, wafer/die transport device 110 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 3A or 3B may be implemented as multiple, distributed devices. Additionally, or alternatively, a set of devices (e.g., one or more devices) of environment 100 may perform one or more functions described as being performed by another set of devices of environment 100.

FIGS. 2A-2K are diagrams of one or more example implementations 200 described herein. Example implementation(s) 200 may include one or more example implementations of forming a tungsten via for an MTJ interconnect. The tungsten via may be formed as a via interconnection between an MTJ and a copper interconnect. A process of forming a tungsten via and/or connecting an MTJ to a copper interconnect may include one or more operations described with respect to FIGS. 2A-2K.

As shown in FIG. 2A, and by reference number 202, a pre-cleaning tool (e.g., pre-cleaning tool 102) may pre-clean an upper surface of a copper interconnect within a via. In other words, the pre-cleaning tool may pre-clean a lower region of the via formed on an upper surface of the copper interconnect. In some implementations, the pre-cleaning tool may use plasma-based etching to pre-clean the upper surface of the copper interconnect within the via. In some implementations, the pre-cleaning tool may use an argon ion (e.g., AR+) plasma forming gas and/or a hydrogen ion (H+) plasma forming gas to pre-clean the upper surface of the copper interconnect within the via.

In some implementations, the copper interconnect may be formed in a dielectric layer of a semiconductor device. An etching tool, (e.g., etching tool 108) may form the via based on etching a portion of the dielectric layer above the copper interconnect.

Figure 2B:
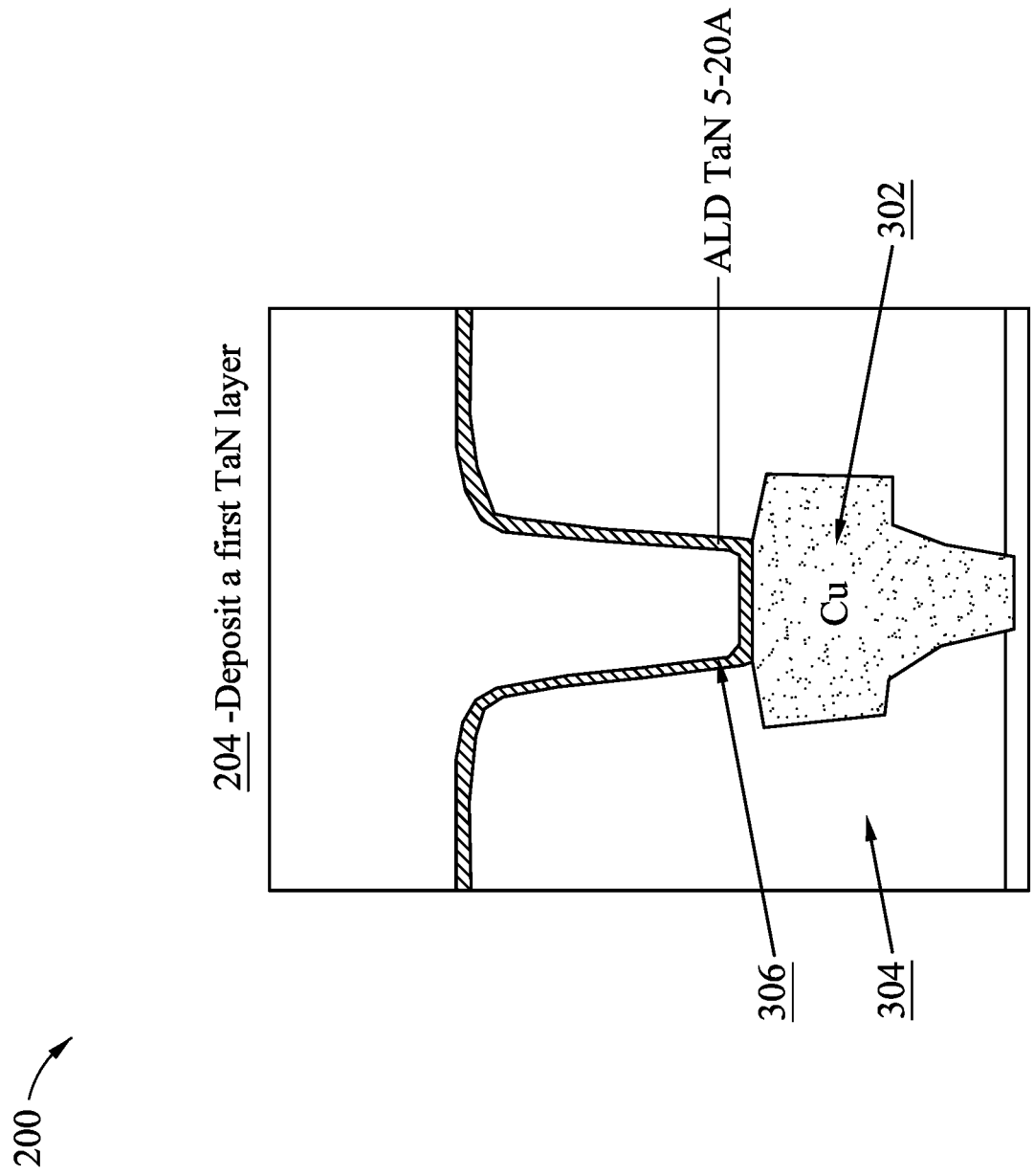

As shown in FIG. 2B, and by reference number 204, a deposition tool (e.g., deposition tool 104) may deposit a first tantalum nitride (TaN) layer on an upper surface of the copper interconnect and within the via. In some implementations, the deposition tool may use in-situ deposition, such as atomic layer deposition, to deposit the first tantalum nitride layer. Based on the deposition tool using atomic layer deposition, the first tantalum nitride layer may comprise a fluorine barrier layer that reduces or prevents fluorine corrosion. In some implementations, the first tantalum nitride layer may be doped with carbon. In some implementations, the first tantalum nitride layer (e.g., deposited using atomic layer deposition) may have a thickness in a range from approximately 5 angstroms to approximately 20 angstroms.

Figure 2C:
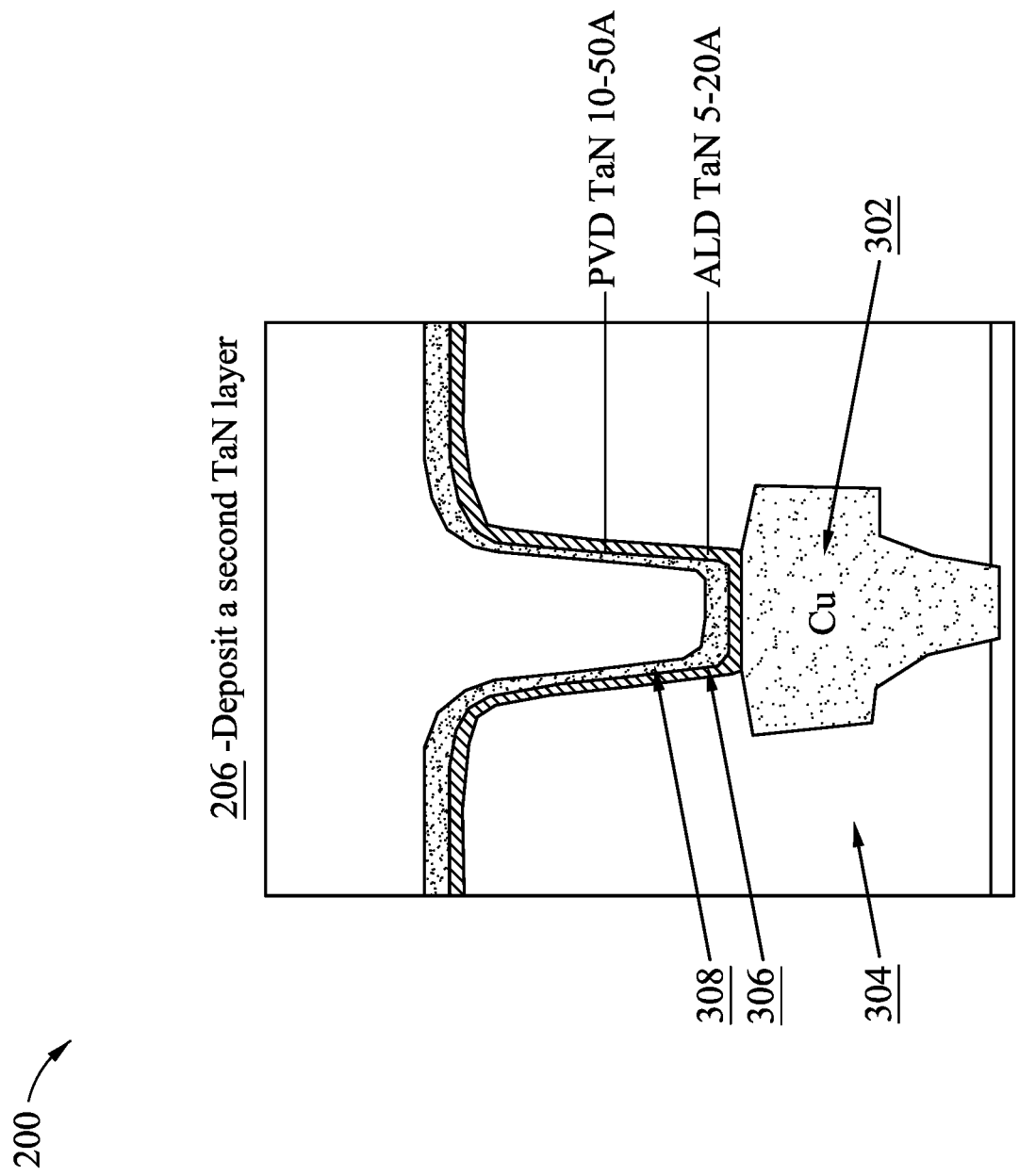

As shown in FIG. 2C, and by reference number 206, the deposition tool (e.g., deposition tool 104) may deposit a second tantalum nitride layer on an upper surface of the first tantalum nitride layer and within the via. In some implementations, the deposition tool may use in-situ deposition, such as physical vapor deposition, to deposit the second tantalum nitride layer. Based on the deposition tool using physical vapor deposition, the second tantalum nitride layer may comprise a copper diffusion barrier layer that reduces or prevents copper diffusion of the copper interconnect (e.g., into the via). In some implementations, the second tantalum nitride layer (e.g., deposited using physical vapor deposition) may have a thickness in a range from approximately 10 angstroms to approximately 50 angstroms.

In some implementations (not shown), the deposition tool may deposit the second tantalum nitride layer on the upper surface of the copper interconnect and may deposit the first tantalum nitride layer on the upper surface of the second tantalum nitride layer. In other words, the deposition tool may deposit a plurality of layers of tantalum nitride using atomic layer deposition first and using physical vapor deposition second or the deposition tool may deposit the plurality of layers of tantalum nitride using physical vapor deposition first and using atomic layer deposition second.

Figure 2D:
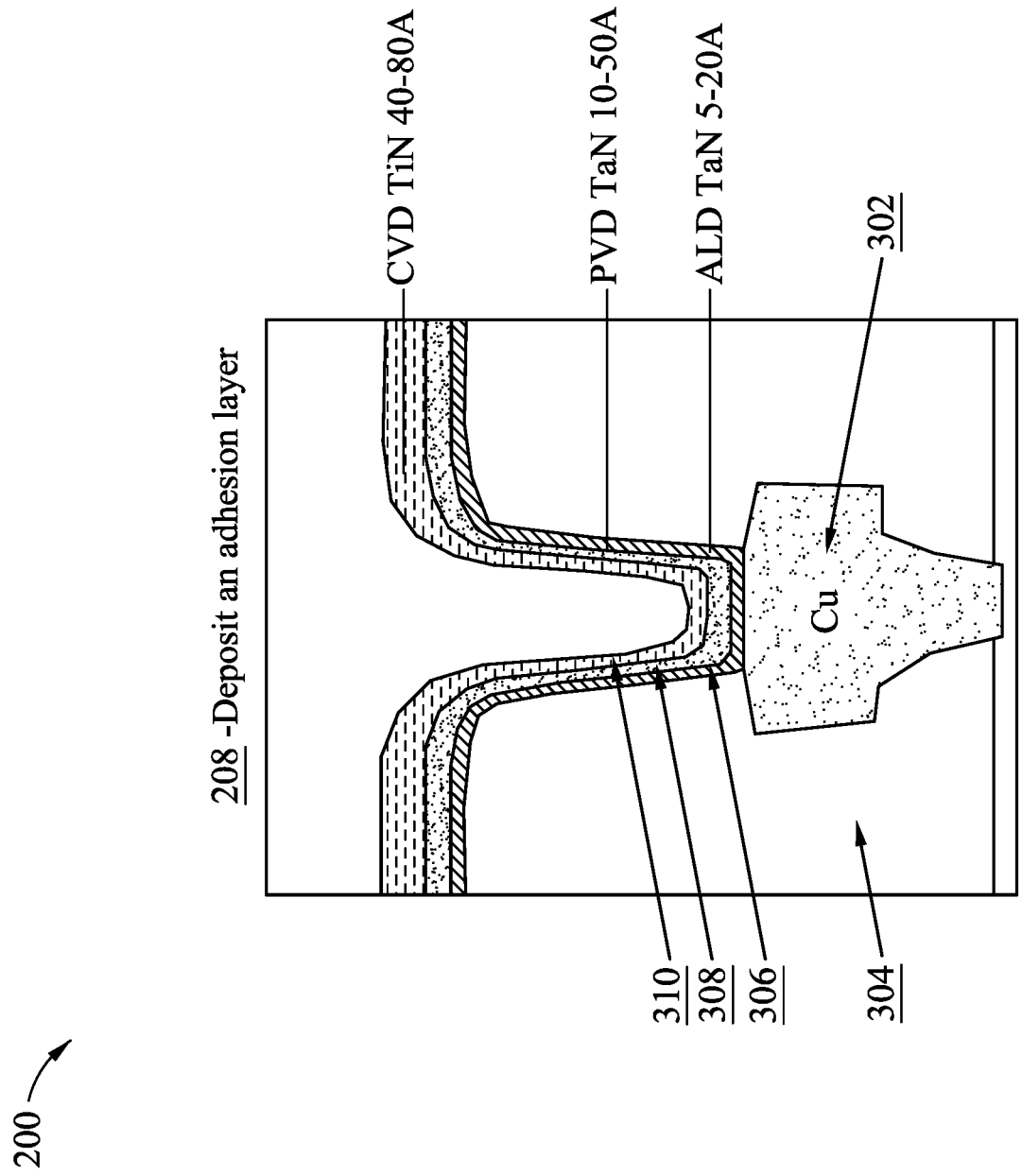

As shown in FIG. 2D, and by reference number 208, the deposition tool (e.g., deposition tool 104) may deposit an adhesion layer, such as a titanium nitride layer, on an upper surface of one of the first tantalum nitride layer or the second tantalum nitride layer and within the via. In other words, the deposition tool may deposit the adhesion layer on an upper surface of one or more tantalum nitride layers (e.g., on an upper surface of an upper layer of the one or more tantalum nitride layers). In some implementations, the adhesion layer may provide a surface to which tungsten metal may be deposited with reduced peeling. In some implementations, the deposition tool may deposit the adhesion layer using in-situ deposition, such as chemical vapor deposition or plasma vapor deposition. In some implementations, the deposition tool may deposit the adhesion layer by depositing titanium with nitridation gas. In some implementations, the adhesion layer may have a thickness in a range from approximately 40 angstroms to approximately 80 angstroms.

Figure 2E:
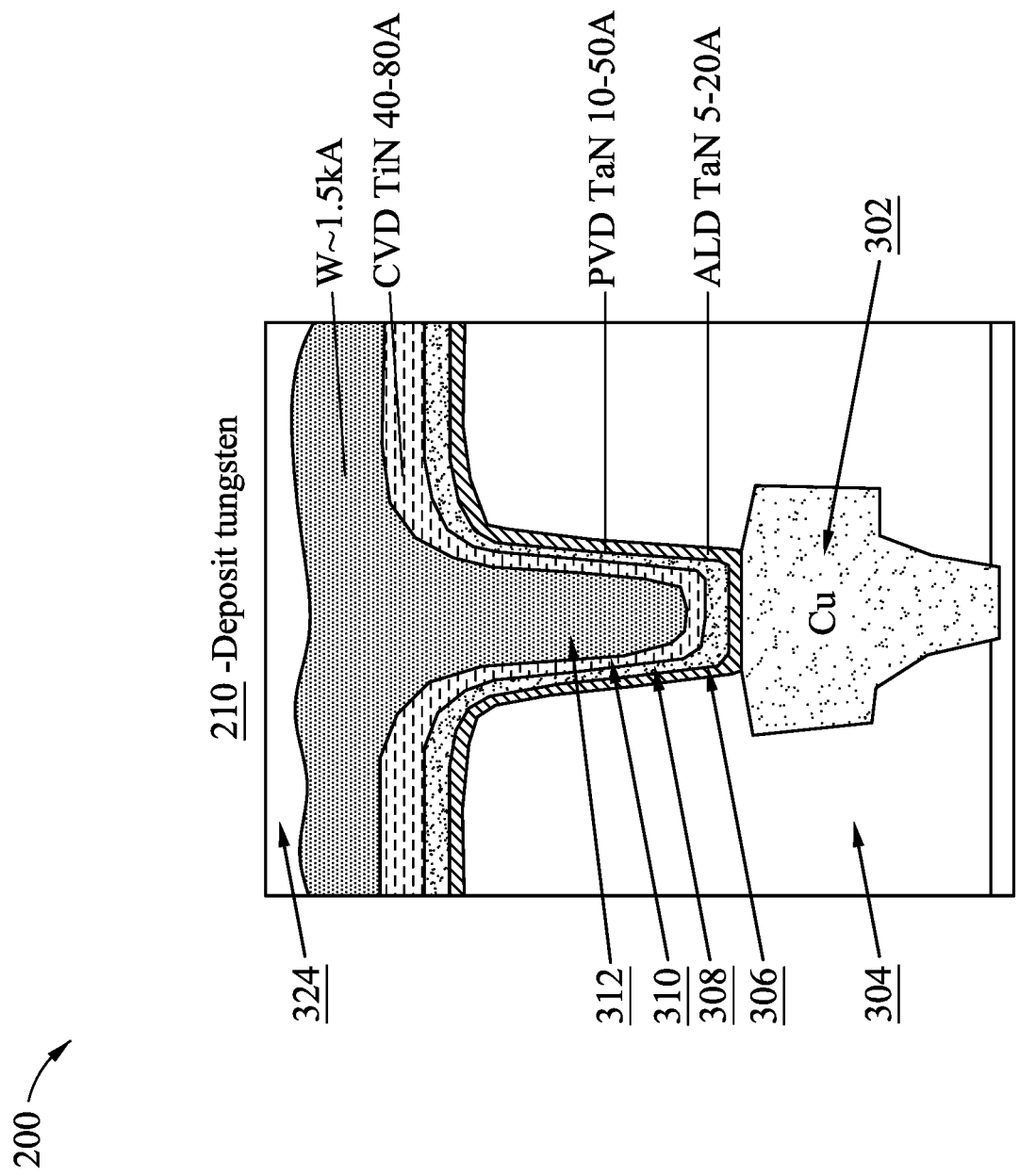

As shown in FIG. 2E, and by reference number 210, the deposition tool (e.g., deposition tool 104) may deposit tungsten within the via. In some implementations, the deposition tool may deposit the tungsten (e.g., tungsten metal) on an upper surface of the adhesion layer and within the via for via interconnection of an MTJ and the copper interconnect. In some implementation, the deposition tool may use in-situ deposition of tungsten metal to deposit the tungsten. In some implementations, the tungsten metal may have a deposited thickness of at least 700 angstroms, at least 1,300 angstroms, about 1,500 angstroms, and/or the like.

Figure 2F:
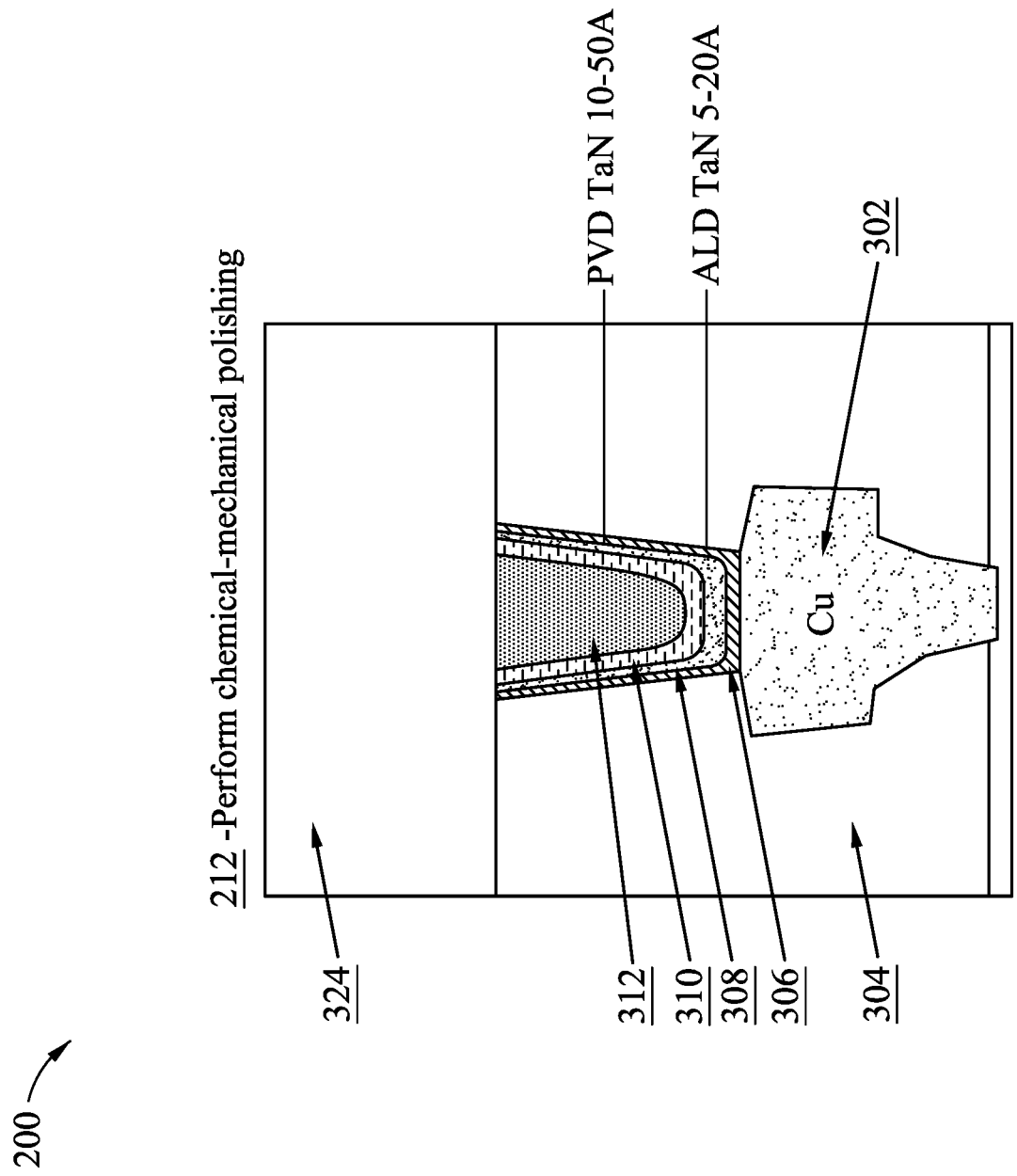

As shown in FIG. 2F, and by reference number 212, a CMP tool (e.g., CMP tool 106) may perform chemical-mechanical polishing. In some implementations, the CMP tool may planarize one or more previously deposited layers and the tungsten to form a planar upper surface of the via. In some implementations, the CMP tool may planarize the one or more previously deposited layers and the tungsten such that the tungsten has a thickness in a range from approximately 700 angstroms to approximately 1,300 angstroms, about 1,500 angstroms, and/or the like.

Figure 2G:
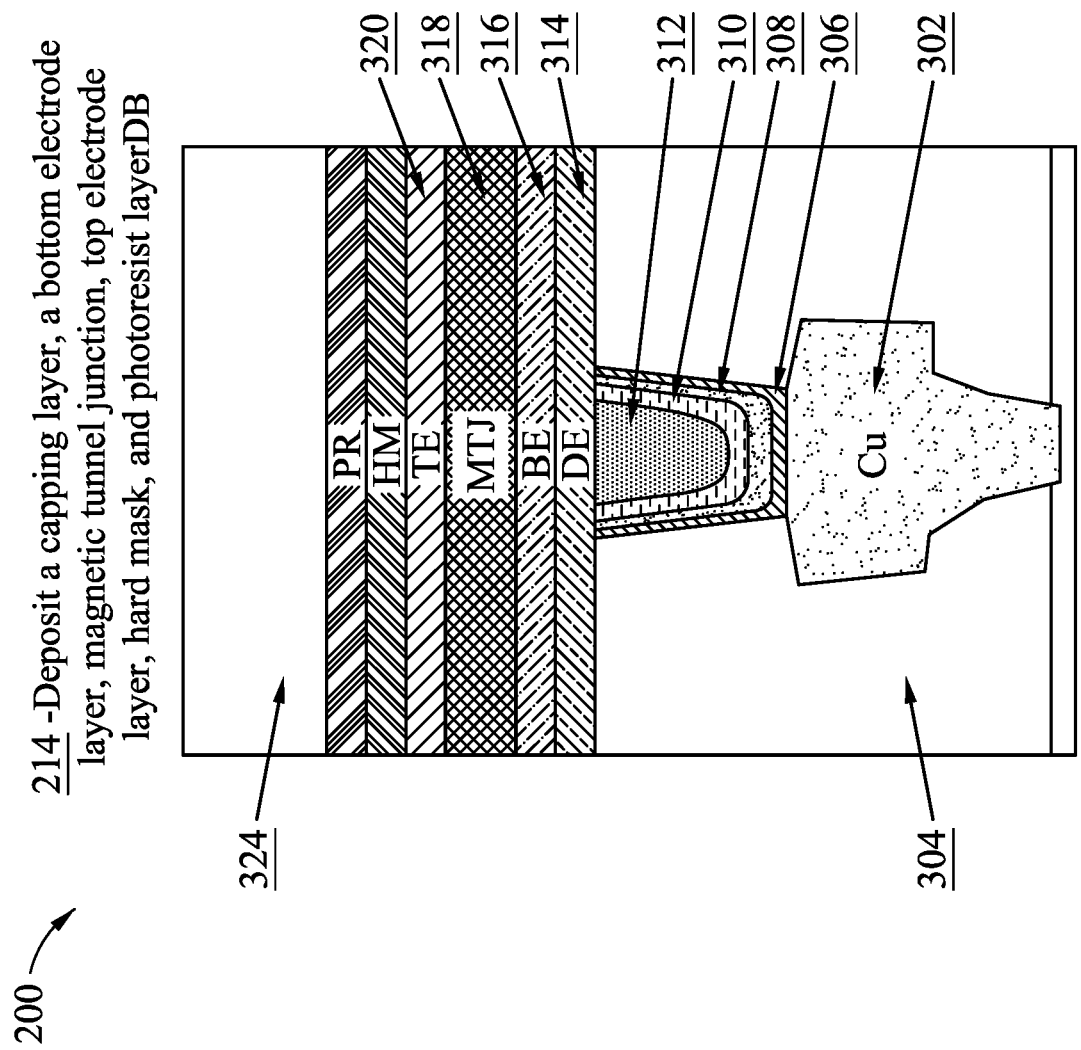

As shown in FIG. 2G, and by reference number 214, the deposition tool (e.g., the deposition tool 104) may deposit a diffusion barrier, a bottom electrode layer, an MTJ, a top electrode layer, a hard mask, and a photoresist layer on an upper surface of the via. The diffusion barrier may reduce electromigration from the bottom electrode into the tungsten material within the via. The bottom electrode layer and/or the top electrode layer may provide an electrical coupling to the MTJ during operation of the MTJ. The hard mask layer and/or the hard mask may selectively protect material from etching during an etching operation. In some implementations, the deposition tool may deposit a diffusion barrier between the bottom electrode and the upper surface of the via. The diffusion barrier may reduce electromigration from the bottom electrode into the tungsten material within the via.

In some implementations, the MTJ may include a stack of multiple layers of materials. For example, the MTJ may include a buffer layer (e.g., a non-magnetic and conductive layer that is configured to reduce diffusion from the bottom electrode into other portions of the), a seed layer, a hard bias stack layer, an anti-parallel coupling (APC) layer, a reference layer, a barrier layer, a free layer, a perpendicular magnetic anisotropy (PMA) protection layer, and/or a capping layer, among other examples.

Figure 2H:
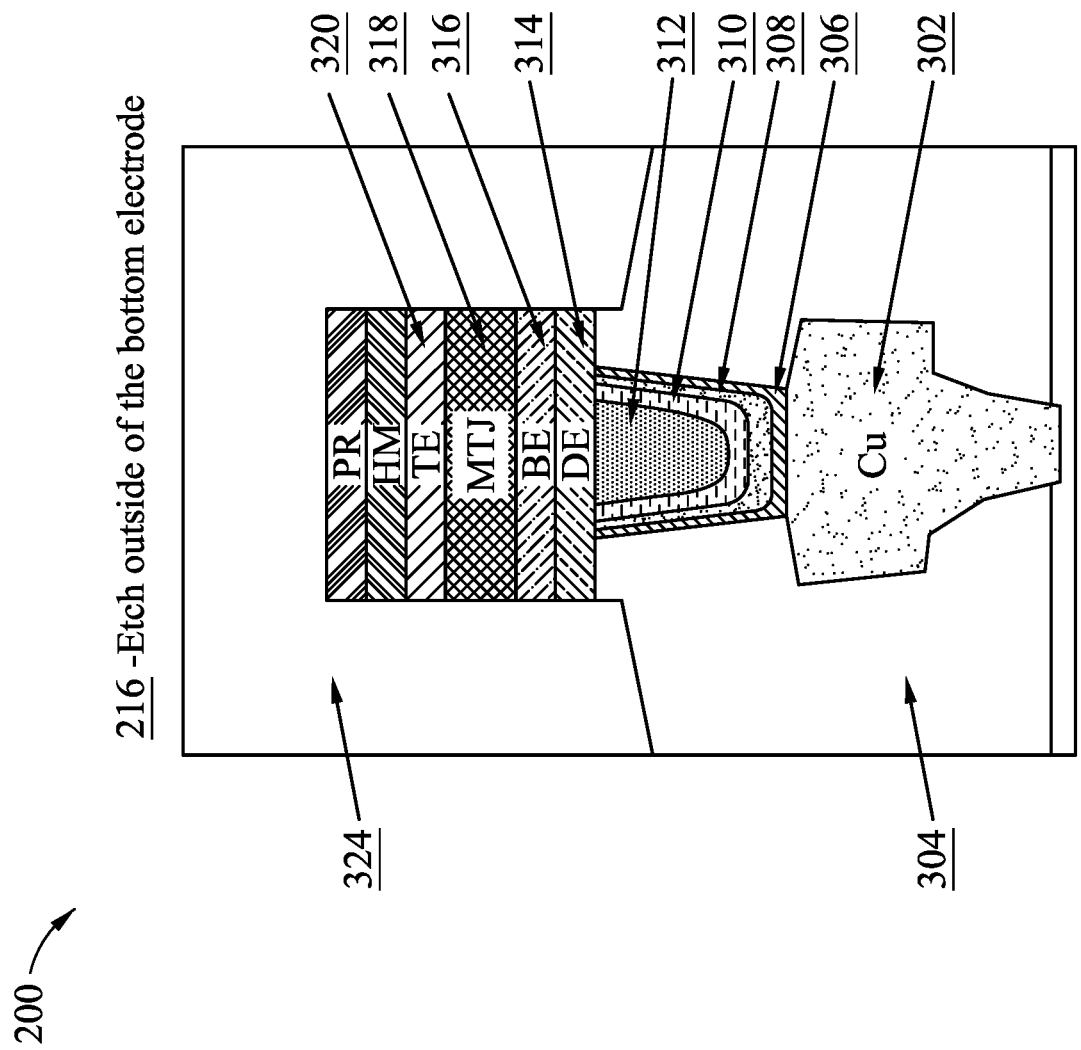

As shown in FIG. 2H, and by reference number 216, an etching tool (e.g., etching tool 108) may etch outside of the bottom electrode. In some implementations, the etching tool may leave a volume of material surrounding an upper portion of the via and may etch outside of the volume of material surrounding the upper portion of the via. In some implementations, the etching tool may use a mask to etch outside of the via.

Figure 2I:
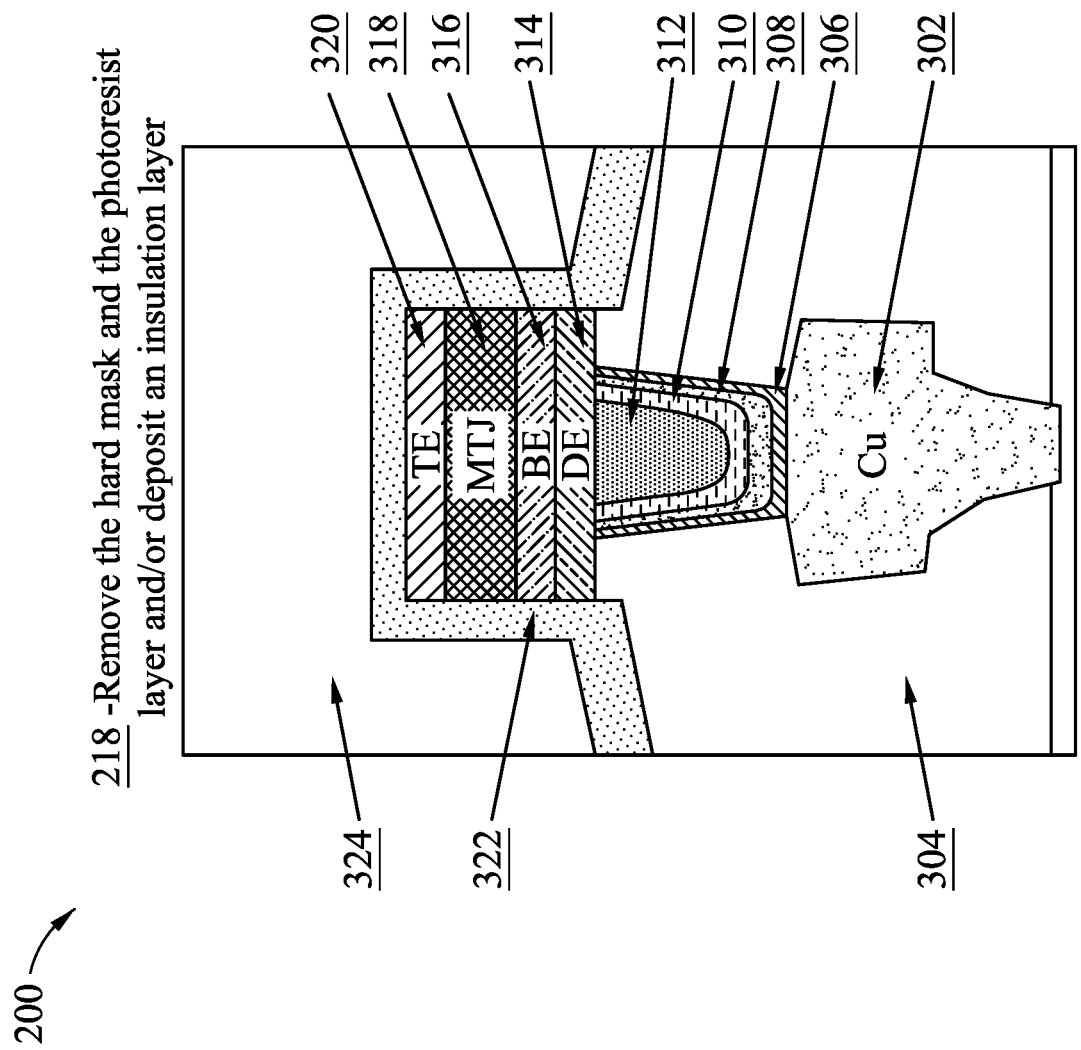

As shown in FIG. 2I, and by reference number 218, the etching tool (e.g., etching tool 108) may remove the photoresist layer and the hard mask from an upper surface of the top electrode and/or the deposition tool (e.g., deposition tool 104) may deposit an insulation layer on the top electrode. For example, the etching tool (e.g., etching tool 108) may etch the photoresist layer (e.g., using a wet etching device, a plasma etching device, and/or the like) and may etch the hard mask using one or more etching devices and/or one or more etching operations.

Figure 2J:
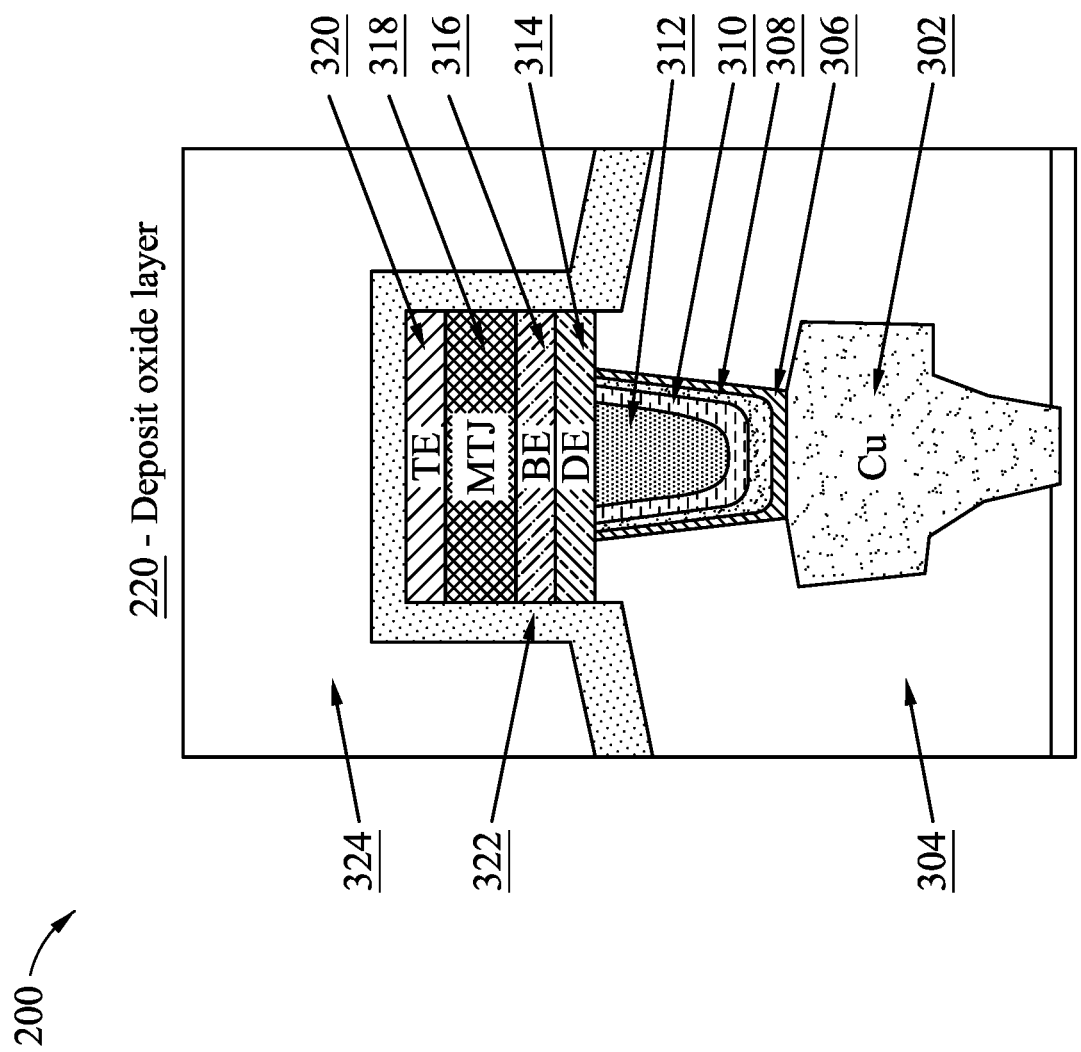

As shown in FIG. 2J, and by reference number 220, the deposition tool (e.g., deposition tool 104) may deposit an oxidation layer on an upper surface of the insulation layer. In some implementations, the oxidation layer may include silicon oxide. In some aspects, the oxide layer may instead include silicon nitride.

Figure 2K:
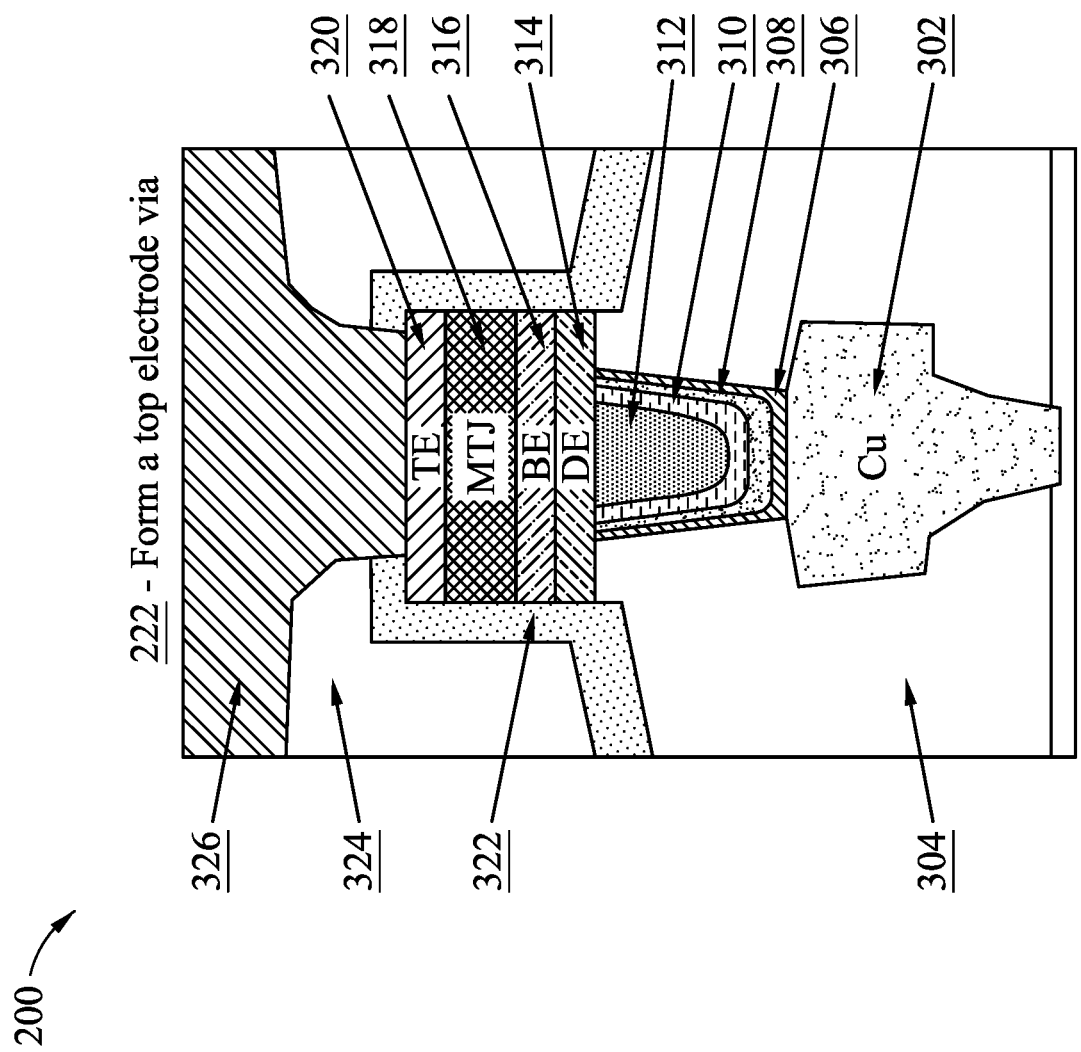

As shown in FIG. 2K, and by reference number 222, one or more tools (e.g., pre-cleaning tool 102, deposition tool 104, CMP tool 106, etching tool 108, and/or the like) may remove a portion of the insulating layer and form a top electrode via on a portion of the upper surface of the top electrode. The top via may be filled to provide a metal connection to another component of the semiconductor device, another device, and/or the like. For example, the top via may provide a metal connection to a controller of the semiconductor device.

The number and arrangement of structures, layers, and/or the like shown in FIGS. 2A-2K are provided as an example. In practice, a semiconductor device including additional structures and/or layers, fewer structures and/or layers, different structures and/or layers, or differently arranged structures and/or layers than those shown in FIGS. 2A-2K may be processed according to the techniques described above in connection with FIGS. 2A-2K.

Figure 3A:
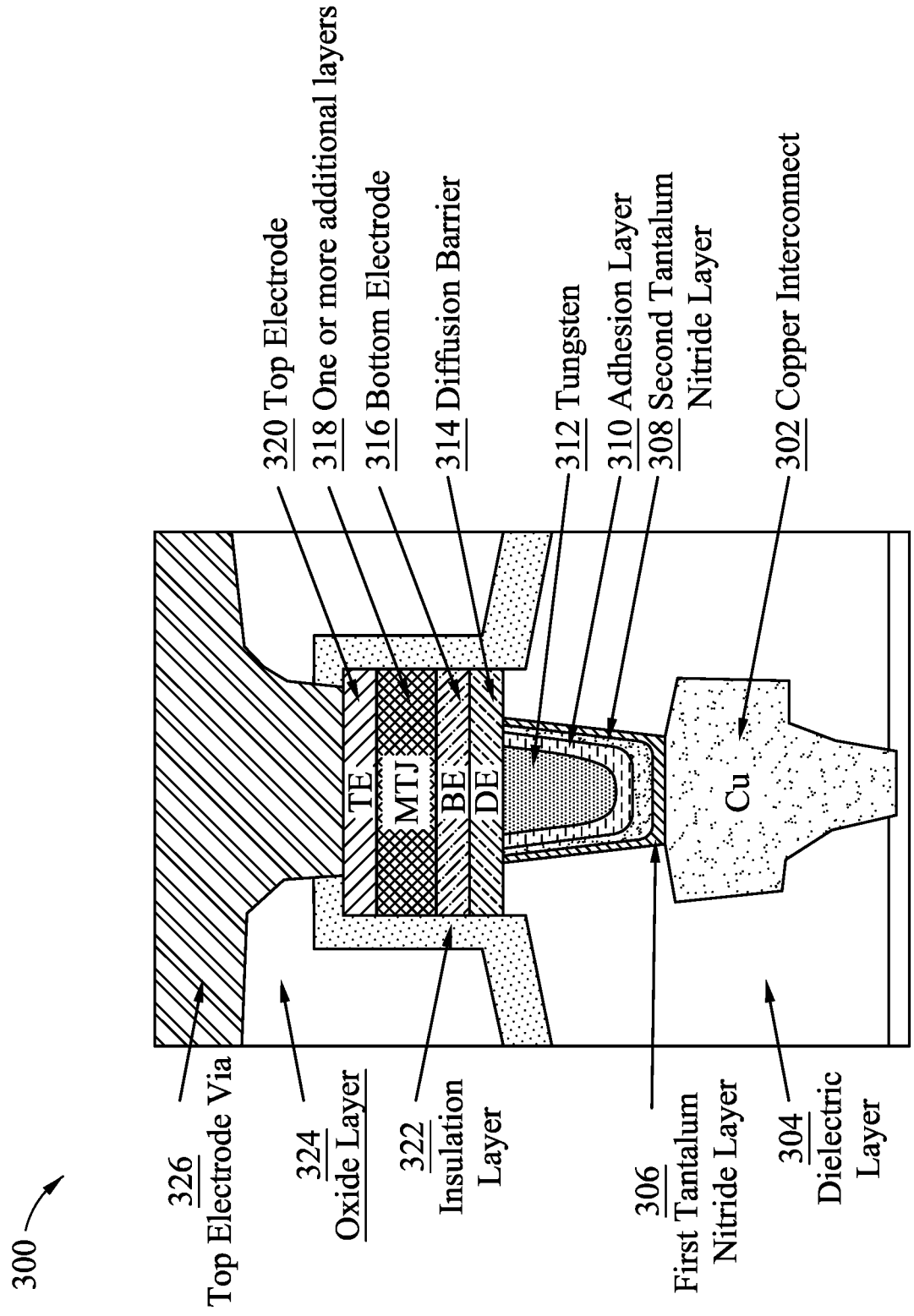
FIGS. 3A and 3B are diagrams of an example semiconductor structure formed based on the example techniques described in connection with FIGS. 2A-2K.
Figure 3B:
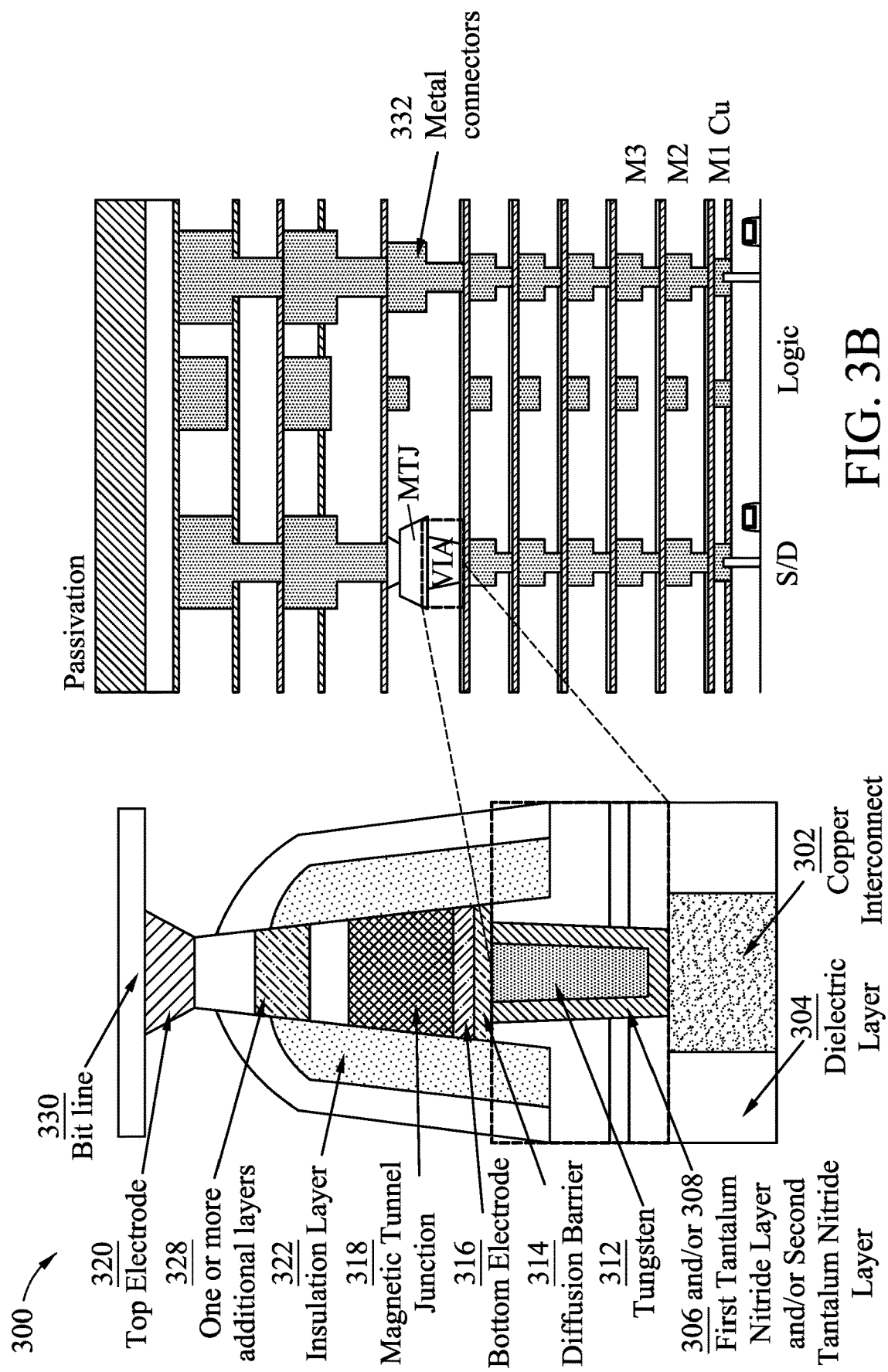

FIGS. 3A and 3B is a diagram of an example portion of a semiconductor device 300 formed based on the example techniques described in connection with FIGS. 2A-2K. In some implementations, the semiconductor device 300 may include a back end of line embedded MRAM. As shown in FIGS. 3A and 3B, semiconductor device 300 may include a copper interconnect 302 formed within a dielectric layer 304. The semiconductor device 300 may further include, disposed within a via of the dielectric layer 304 and above the copper interconnect 302, a first tantalum nitride layer 306 disposed on an upper surface of the copper interconnect 302, and a second tantalum nitride layer 308 disposed on an upper surface of the first tantalum nitride layer 306. In some implementations, the first tantalum nitride layer 306 may include a fluorine barrier and the second tantalum nitride layer 308 may include a copper diffusion barrier. In some implementations, the second tantalum nitride layer 308 may include a fluorine barrier and the first tantalum nitride layer 306 may include a copper diffusion barrier. The first tantalum nitride layer 306 and/or the second tantalum nitride layer 308 may be doped with carbon (e.g., a tantalum nitride layer that includes the fluorine barrier).

In some implementations, the first tantalum nitride layer 306 and the second tantalum nitride layer 308 may have a combined thickness in a range from approximately 15 angstroms to approximately 70 angstroms. In some implementations, the first tantalum nitride layer 306 may have a thickness in a range of approximately 5 to 20 angstroms (e.g., 10 angstroms). In some implementations, the second tantalum nitride layer 308 may have a thickness in a range of approximately 10 to 50 angstroms (e.g., 17 to 20 angstroms).

As further shown in FIG. 3A, semiconductor device 300 may include an adhesion layer 310 (e.g., including titanium nitride) disposed on an upper surface of the second tantalum nitride layer 308 (e.g., on an upper surface of one or more tantalum nitride layers) and tungsten 312 (e.g., tungsten metal) disposed on an upper surface of the adhesion layer. In some implementations, the tungsten 312 may form a via contact. In some implementations, the tungsten may have a thickness of approximately 700 angstroms to 1,300 angstroms.

The semiconductor device 300 may further include a diffusion barrier 314 disposed on the tungsten 312 and/or upper surfaces of one or more materials within the via, a bottom electrode 316 disposed on the diffusion barrier 314 an MTJ 318 disposed on an upper surface of the bottom electrode 316, a top electrode 320 disposed on an upper surface of the MTJ 318, and an insulating layer 322 disposed on an upper surface of the semiconductor device 300 (e.g., on the top electrode 320, on the dielectric layer 304, and/or on sides of the top electrode 320, the MTJ 318, and/or the bottom electrode 316.

The semiconductor device 300 may include an oxide layer 324 disposed on the insulation layer 322. In some implementations, the oxide layer 324 may include an oxide-based material and/or may provide an insulating barrier and/or a support structure for the semiconductor device 300. In some implementations, the semiconductor device 300 may include a top electrode via 326 that provides an electrical connection to the MTJ 318 through the top electrode 320. In some implementations, the top electrode via 326 may be coupled to one or more additional conductive materials and/or a power supply or drain.

As shown in FIG. 3B, the semiconductor device 300 may include additional layers between the MTJ 318 and the top electrode 320. In some implementations, the one or more additional layers may be included in the MTJ 318. In some implementations, the one or more additional layers may include a free layer, a tunnel barrier layer, a reference layer, and/or a diffusion barrier, among other examples. In some implementations, the one or more additional layers may include a cobalt-based layer, a tantalum-based layer, an iron-based layer, and/or a magnesium oxide-based layer, among other examples.

As further shown in FIG. 3B, the semiconductor device 300 may include a bit line 330 that provides an electrical connection to the top electrode. In some implementations, the bit line 330 may provide a voltage and/or current to the top electrode 320 associated with operation of the MTJ 318. In some implementations, the MTJ 318 may be connected to a source/drain of the semiconductor device through one or more of the metal connectors 332 and/or one or more bit lines 330. In some implementations, the bit line 330 may provide a voltage and/or current to one or more additional metal connectors 332 that may be connected to or more active areas of the semiconductor device 300. For example, the bit line 330 may provide a voltage and/or a current, through the one or more metal connectors 332 to one or more metal layers and/or bit lines 330 of the semiconductor device 300, to a logic-based active area of the semiconductor device 300.

As indicated above, FIGS. 3A and 3B are provided as an example. Other examples may differ from what is described with regard to FIGS. 3A and 3B.

Figure 4:
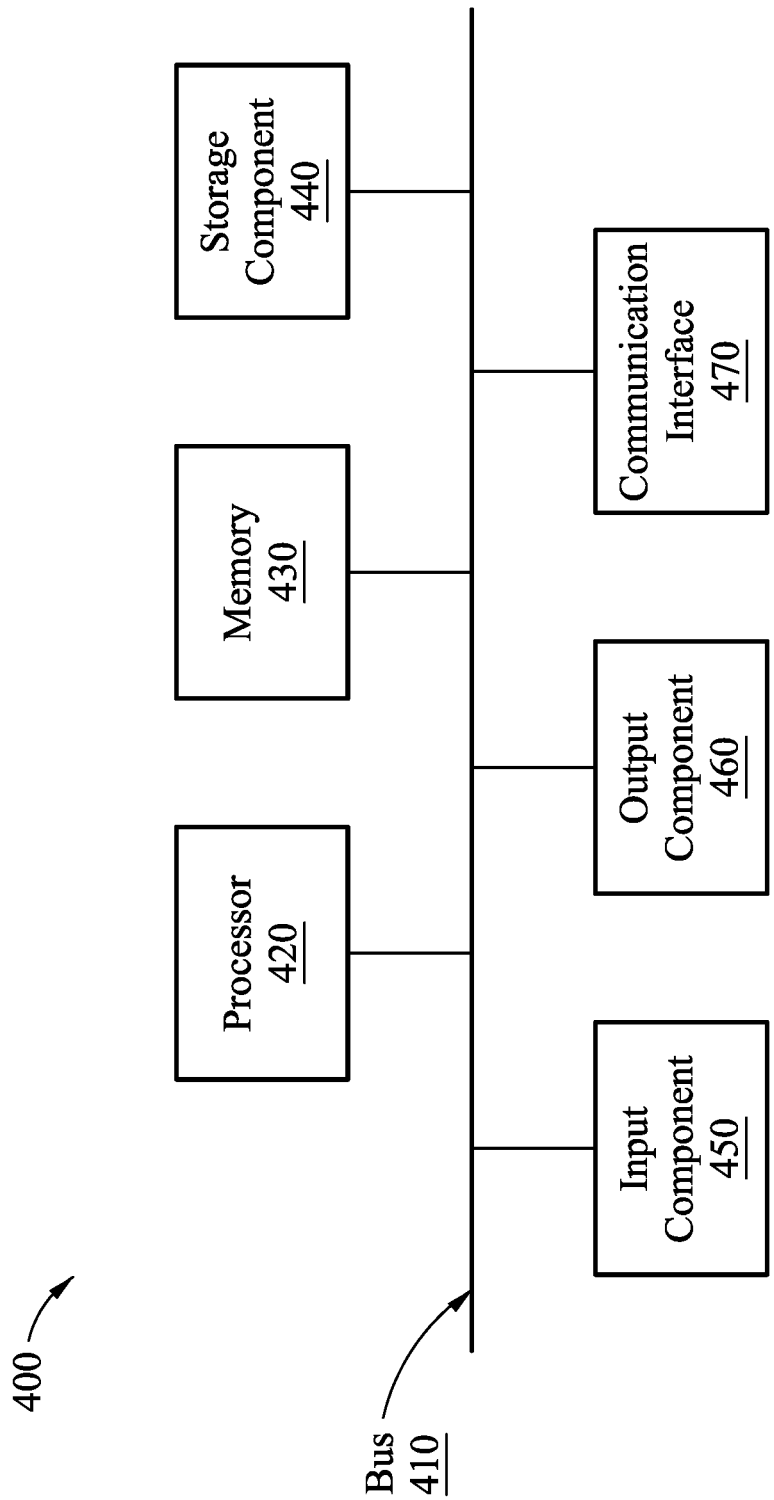
FIG. 4 is a diagram of example components of one or more devices of FIG. 1.

FIG. 4 is a diagram of example components of a device 400. In some implementations, pre-clean tool 102, deposition tool 104, CMP tool 106, etching tool 108, and/or wafer/die transport device 110 may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among multiple components of device 400. Processor 420 is implemented in hardware, firmware, and/or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a component for determining location (e.g., a global positioning system (GPS) component) and/or a sensor (e.g., an accelerometer, a gyroscope, an actuator, another type of positional or environmental sensor, and/or the like). Output component 460 includes a component that provides output information from device 400 (via, e.g., a display, a speaker, a haptic feedback component, an audio or visual indicator, and/or the like).

Communication interface 470 includes a transceiver-like component (e.g., a transceiver, a separate receiver, a separate transmitter, and/or the like) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, a radio frequency (RF) interface, a universal serial bus (USB) interface, a Wi-Fi interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. As used herein, the term "computer-readable medium" refers to a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
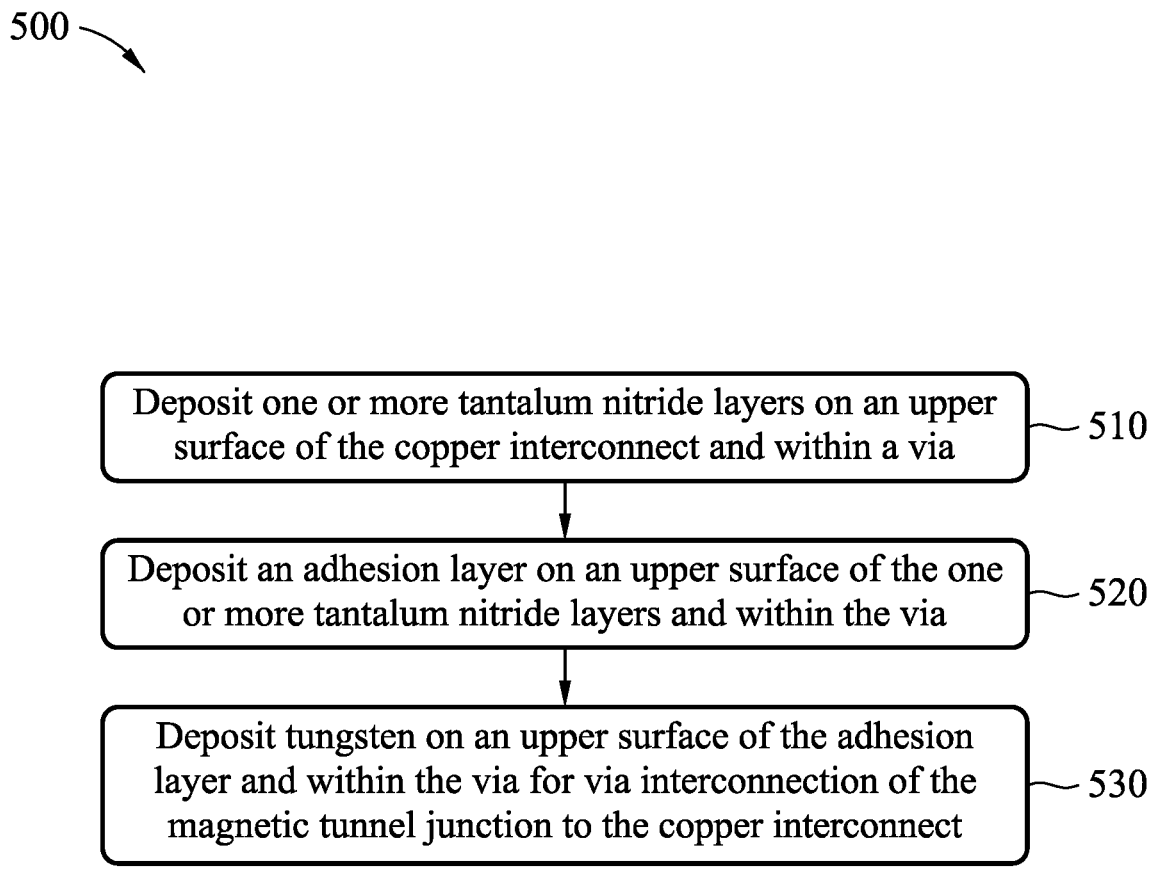
FIGS. 5 and 6 are flowcharts of example processes for application of a tungsten via for an MTJ interconnect.

FIG. 5 is a flowchart of an example process 500 associated with forming a tungsten via for an MTJ interconnect. In some implementations, one or more process blocks of FIG. 5 may be performed by one or more semiconductor processing tools (e.g., pre-clean tool 102, deposition tool 104, CMP tool 106, etching tool 108, and/or the like). In some implementations, one or more process blocks of FIG. 5 may be performed by one or more components of a device 400, such as processor 420, memory 430, storage component 440, input component 450, output component 460, communication interface 470, and/or the like.

As shown in FIG. 5, process 500 may include depositing one or more tantalum nitride layers on an upper surface of a copper interconnect and within a via (block 510). For example, the one or more semiconductor processing devices (e.g., pre-clean tool 102, deposition tool 104, CMP tool 106, and/or etching tool 108) may deposit one or more tantalum nitride layers 306 308 on an upper surface of a copper interconnect 302 and within a via, as described above.

As further shown in FIG. 5, process 500 may include depositing an adhesion layer on an upper surface of the one or more tantalum nitride layers and within the via (block 520). For example, the one or more semiconductor processing devices (e.g., pre-clean tool 102, deposition tool 104, CMP tool 106, and/or etching tool 108) may deposit an adhesion layer 310 on an upper surface of the one or more tantalum nitride layers 306 308 and within the via, as described above.

As further shown in FIG. 5, process 500 may include depositing tungsten on an upper surface of the adhesion layer and within the via for via interconnection of a magnetic tunnel junction to the copper interconnect (block 530). For example, the one or more semiconductor processing devices (e.g., pre-clean tool 102, deposition tool 104, CMP tool 106, and/or etching tool 108) may deposit tungsten 312 on an upper surface of the adhesion layer 310 and within the via for via interconnection of a magnetic tunnel junction 318 to the copper interconnect 302, as described above.

Process 500 may include additional implementations, such as any single implementation or any combination of implementations described below and/or in connection with one or more other processes described elsewhere herein.

In a first implementation, depositing the one or more tantalum nitride layers on the upper surface of the copper interconnect and within the via comprises depositing a first tantalum nitride layer, using atomic layer deposition, on the upper surface of the copper interconnect and within the via, and depositing a second tantalum nitride layer, using physical vapor deposition, on an upper surface of the first tantalum nitride layer and within the via.

In a second implementation, depositing the one or more tantalum nitride layers on the upper surface of the copper interconnect and within the via comprises depositing a first tantalum nitride layer, using physical vapor deposition, on the upper surface of the copper interconnect and within the via, and depositing a second tantalum nitride layer, using atomic layer deposition, on an upper surface of the first tantalum nitride layer and within the via.

In a third implementation, at least one layer of the one or more tantalum nitride layers is doped with carbon.

In a fourth implementation, the adhesion layer comprises titanium nitride.

In a fifth implementation, depositing the adhesion layer comprises depositing titanium with nitridation gas using one or more of plasma vapor deposition or chemical vapor deposition.

In a sixth implementation, process 500 includes removing oxides from an upper surface of the copper interconnect before depositing the one or more tantalum nitride layers on the upper surface of the copper interconnect.

In a seventh implementation, removing the oxides from the upper surface of the copper interconnect comprises performing plasma-based etching of the upper surface of the copper interconnect.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
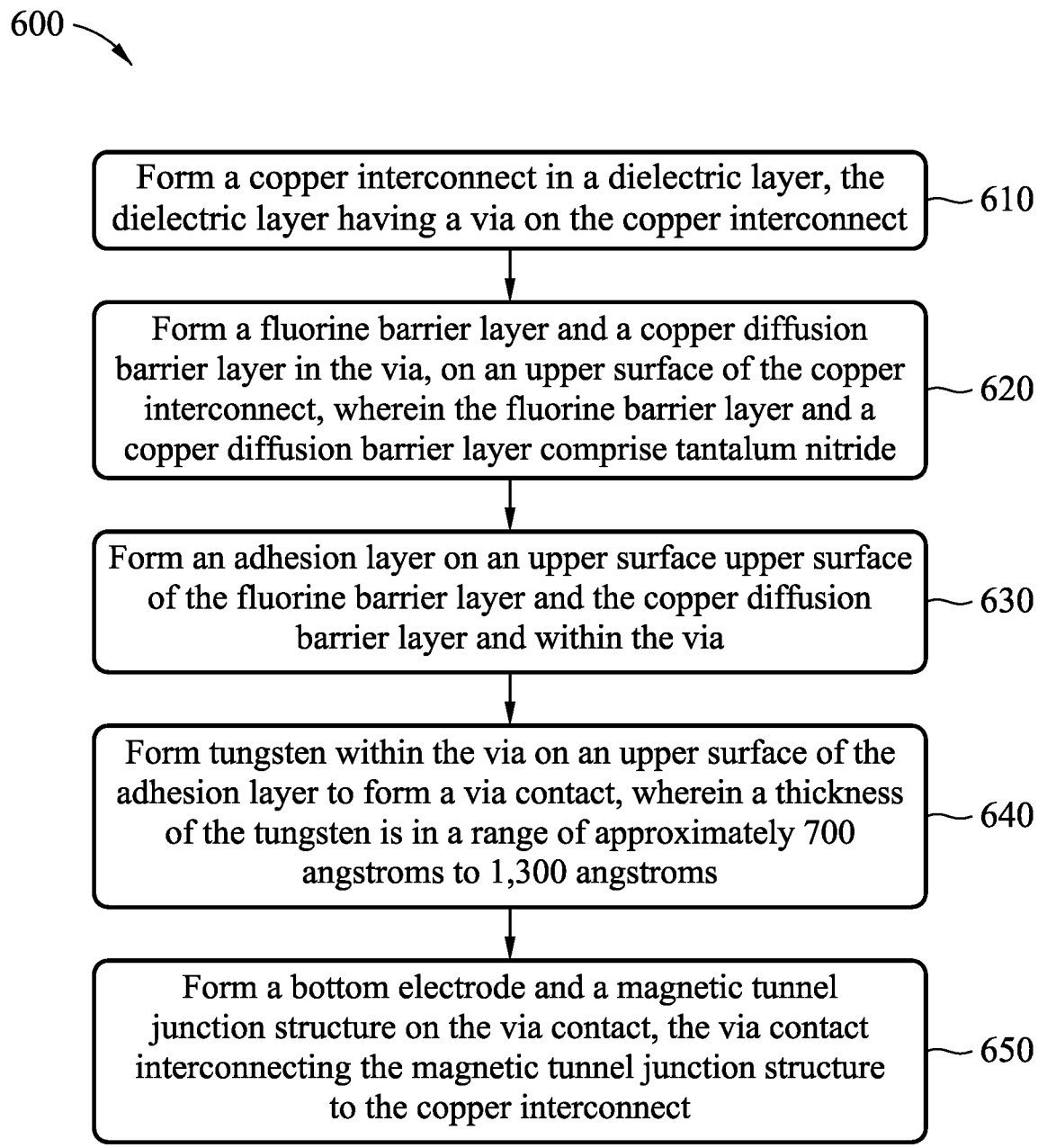

FIG. 6 is a flowchart of an example process 600 associated with forming a tungsten via for an MTJ interconnect. In some implementations, one or more process blocks of FIG. 6 may be performed by one or more semiconductor processing tools (e.g., pre-clean tool 102, deposition tool 104, CMP tool 106, etching tool 108, and/or the like). In some implementations, one or more process blocks of FIG. 6 may be performed by one or more components of a device 400, such as processor 420, memory 430, storage component 440, input component 450, output component 460, communication interface 470, and/or the like.

As shown in FIG. 6, process 600 may include forming a copper interconnect in a dielectric layer, the dielectric layer having a via on the copper interconnect (block 610). For example, the one or more semiconductor processing tools (e.g., pre-clean tool 102, deposition tool 104, CMP tool 106, and/or etching tool 108) may form a copper interconnect 302 in a dielectric layer 304, the dielectric layer 304 having a via on the copper interconnect 302, as described above.

As further shown in FIG. 6, process 600 may include forming a fluorine barrier layer and a copper diffusion barrier layer in the via, on an upper surface of the copper interconnect, wherein the fluorine barrier layer and the copper diffusion barrier layer comprise tantalum nitride (block 620). For example, the one or more semiconductor processing tools (e.g., pre-clean tool 102, deposition tool 104, CMP tool 106, and/or etching tool 108) may form a fluorine barrier layer 306 or 308 and a copper diffusion barrier layer 306 or 308 in the via, on an upper surface of the copper interconnect 302, wherein the fluorine barrier layer 306 or 308 and the copper diffusion barrier layer 306 or 308 comprise tantalum nitride, as described above.

As further shown in FIG. 6, process 600 may include forming an adhesion layer on an upper surface of the fluorine barrier layer and the copper diffusion barrier layer and within the via (block 630). For example, the one or more semiconductor processing tools (e.g., pre-clean tool 102, deposition tool 104, CMP tool 106, and/or etching tool 108) may form an adhesion layer 310 on an upper surface of the fluorine barrier layer 306 or 308 and the copper diffusion barrier layer 306 or 308 and within the via, as described above.

As further shown in FIG. 6, process 600 may include forming tungsten within the via on an upper surface of the adhesion layer to form a via contact, wherein a thickness of the tungsten is in a range of approximately 700 angstroms to 1,300 angstroms (block 640). For example, the one or more semiconductor processing tools (e.g., pre-clean tool 102, deposition tool 104, CMP tool 106, and/or etching tool 108) may form tungsten 312 within the via on an upper surface of the adhesion layer 310 to form a via contact, wherein a thickness of the tungsten 312 is in a range of approximately 700 angstroms to 1,300 angstroms, as described above.

As further shown in FIG. 6, process 600 may include forming a bottom electrode and a magnetic tunnel junction structure on the via contact, the via contact interconnecting the magnetic tunnel junction structure to the copper interconnect (block 650). For example, the one or more semiconductor processing tools (e.g., pre-clean tool 102, deposition tool 104, CMP tool 106, and/or etching tool 108) may form a bottom electrode 316 and a magnetic tunnel junction structure 318 on the via contact 312, the via contact 312 interconnecting the magnetic tunnel junction 318 to the copper interconnect 302, as described above.

Process 600 may include additional implementations, such as any single implementation or any combination of implementations described below and/or in connection with one or more other processes described elsewhere herein.

In a first implementation, forming the fluorine barrier layer and the copper diffusion barrier layer comprises one or more of depositing the fluorine barrier layer using atomic layer deposition, or depositing the copper diffusion barrier layer using physical vapor deposition.

In a second implementation, forming the fluorine barrier layer and the copper diffusion barrier layer comprises depositing the fluorine barrier layer on an upper surface of the copper interconnect and within the via, and depositing the copper diffusion barrier layer on an upper surface of the fluorine barrier layer and within the via.

In a third implementation, forming the fluorine barrier layer and the copper diffusion barrier layer comprises depositing the copper diffusion barrier layer on an upper surface of the copper interconnect and within the via, and depositing the fluorine barrier layer on an upper surface of the copper diffusion barrier layer and within the via.

In a fourth implementation, the adhesion layer comprises titanium nitride.

In a fifth implementation, depositing the adhesion layer comprises depositing titanium with nitridation gas using one or more of plasma vapor deposition or chemical vapor deposition.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

As described above, a tungsten via may provide lower resistivity compared with using titanium nitride in a via. One or more tantalum nitride layers may be used to reduce or prevent copper and tungsten intermixing, reduce copper electromigration into an isolating layer of the MTJ, reduce or prevent fluorine from diffusing into the copper interconnect (which could cause copper corrosion), reduce stress on the tungsten, and/or the like. An adhesion layer may promote adhesion of the tungsten to reduce peeling of the tungsten.

As described in greater detail above, some implementations described herein provide one or more methods for connecting an MTJ to a copper interconnect and a device that includes a tungsten via (e.g., a via with tungsten metal as the metal interconnect of the via).

As described in greater detail above, some implementations described herein provide a method for connecting a magnetic tunnel junction to a copper interconnect. The method for connecting magnetic tunnel junction to copper interconnect includes depositing one or more tantalum nitride layers on an upper surface of the copper interconnect and within a via. The method for connecting magnetic tunnel junction to copper interconnect includes depositing an adhesion layer on an upper surface of the one or more tantalum nitride layers and within the via. The method for connecting magnetic tunnel junction to copper interconnect includes depositing tungsten on an upper surface of the adhesion layer and within the via for via interconnection of the magnetic tunnel junction to the copper interconnect.

As described in greater detail above, some implementations described herein provide a method for forming a magnetoresistive random-access memory. The method for forming magnetoresistive random-access memory includes forming a copper interconnect in a dielectric layer, the dielectric layer having a via on the copper interconnect. The method for forming magnetoresistive random-access memory includes forming a fluorine barrier layer and a copper diffusion barrier layer in the via, on an upper surface of the copper interconnect, wherein the fluorine barrier layer and the copper diffusion barrier layer comprise tantalum nitride. The method for forming magnetoresistive random-access memory includes forming an adhesion layer on an upper surface of the fluorine barrier layer and the copper diffusion barrier layer and within the via. The method for forming magnetoresistive random-access memory includes forming tungsten within the via on an upper surface of the adhesion layer to form a via contact, wherein a thickness of the tungsten is in a range of approximately 700 angstroms to 1,300 angstroms. The method for forming magnetoresistive random-access memory includes forming a bottom electrode and a magnetic tunnel junction structure on the via contact, the via contact interconnecting the magnetic tunnel junction structure to the copper interconnect.

As described in greater detail above, some implementations described herein provide a device. The device includes a magnetic tunnel junction. The device includes a copper interconnect. The device includes a via comprising, one or more tantalum nitride layers disposed on an upper surface of the copper interconnect an adhesion layer disposed on an upper surface of the one or more tantalum nitride layers tungsten metal disposed on an upper surface of the adhesion layer for via interconnection of the magnetic tunnel junction to the copper interconnect.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for connecting a magnetic tunnel junction to a copper interconnect, the method comprising:
    depositing one or more tantalum nitride layers on an upper surface of the copper interconnect and within a via,
        wherein at least one of:
            at least one of the one or more tantalum nitride layers is doped with carbon, or
            at least one of the one or more tantalum nitride layers comprises one or more of a fluorine barrier, or a copper diffusion barrier;
    depositing an adhesion layer on an upper surface of the one or more tantalum nitride layers and within the via; and
    depositing tungsten on an upper surface of the adhesion layer and within the via for via interconnection of the magnetic tunnel junction to the copper interconnect.

2. The method of claim 1, wherein depositing the one or more tantalum nitride layers on the upper surface of the copper interconnect and within the via comprises:
    depositing a first tantalum nitride layer, using atomic layer deposition, on the upper surface of the copper interconnect and within the via; and
    depositing a second tantalum nitride layer, using physical vapor deposition, on an upper surface of the first tantalum nitride layer and within the via.

3. The method of claim 1, wherein depositing the one or more tantalum nitride layers on the upper surface of the copper interconnect and within the via comprises:
    depositing a first tantalum nitride layer, using physical vapor deposition, on the upper surface of the copper interconnect and within the via; and
    depositing a second tantalum nitride layer, using atomic layer deposition, on an upper surface of the first tantalum nitride layer and within the via.

4. The method of claim 1, wherein the at least one of the one or more tantalum nitride layers is doped with carbon.

5. The method of claim 1, wherein the adhesion layer comprises titanium nitride.

6. The method of claim 1, wherein depositing the adhesion layer comprises:
    depositing titanium with nitridation gas using one or more of plasma vapor deposition or chemical vapor deposition.

7. The method of claim 1, further comprising:
    removing oxides from the upper surface of the copper interconnect before depositing the one or more tantalum nitride layers on the upper surface of the copper interconnect.

8. The method of claim 7, wherein removing the oxides from the upper surface of the copper interconnect comprises:
    performing plasma-based etching of the upper surface of the copper interconnect.

9. A method for forming a magnetoresistive random-access memory, the method comprising:
    forming a copper interconnect in a dielectric layer, the dielectric layer having a via on the copper interconnect;
    forming a fluorine barrier layer and a copper diffusion barrier layer in the via and on an upper surface of the copper interconnect, wherein the fluorine barrier layer and the copper diffusion barrier layer comprise tantalum nitride;
    forming an adhesion layer on an upper surface of the fluorine barrier layer and the copper diffusion barrier layer and within the via;
    forming tungsten within the via on an upper surface of the adhesion layer to form a via contact, wherein a thickness of the tungsten is in a range of approximately 700 angstroms to 1,300 angstroms; and
    forming a bottom electrode and a magnetic tunnel junction structure on the via contact, the via contact interconnecting the magnetic tunnel junction structure to the copper interconnect.

10. The method of claim 9, wherein forming the fluorine barrier layer and the copper diffusion barrier layer comprises one or more of:
    depositing the fluorine barrier layer using atomic layer deposition; or
    depositing the copper diffusion barrier layer using physical vapor deposition.

11. The method of claim 9, wherein forming the fluorine barrier layer and the copper diffusion barrier layer comprises:
    depositing the fluorine barrier layer on an upper surface of the copper interconnect and within the via; and
    depositing the copper diffusion barrier layer on an upper surface of the fluorine barrier layer and within the via.

12. The method of claim 9, wherein forming the fluorine barrier layer and the copper diffusion barrier layer comprises:
    depositing the copper diffusion barrier layer on an upper surface of the copper interconnect and within the via; and
    depositing the fluorine barrier layer on an upper surface of the copper diffusion barrier layer and within the via.

13. The method of claim 9, wherein the adhesion layer comprises titanium nitride.

14. The method of claim 9, wherein forming the adhesion layer comprises:
    depositing titanium with nitridation gas using one or more of plasma vapor deposition or chemical vapor deposition.

15. A device, comprising:
    a magnetic tunnel junction;
    a copper interconnect; and
    a via comprising:
        one or more tantalum nitride layers disposed on an upper surface of the copper interconnect, wherein at least one of:
- at least one of the one or more tantalum nitride layers is doped with carbon, or
- at least one of the one or more tantalum nitride layers comprises one or more of a fluorine barrier, or a copper diffusion barrier;

an adhesion layer disposed on an upper surface of the one or more tantalum nitride layers; and tungsten metal disposed on an upper surface of the adhesion layer for via interconnection of the magnetic tunnel junction to the copper interconnect.

16. The device of claim 15, wherein the device comprises a back end of line embedded Magnetoresistive random-access memory disposed above the via and including the magnetic tunnel junction.

17. The device of claim 15, wherein the one or more tantalum nitride layers have a combined thickness of between 15 angstroms and 70 angstroms.

18. The device of claim 15, wherein the at least one of the one or more tantalum nitride layers comprise one or more of:
- the fluorine barrier, or
- the copper diffusion barrier.

19. The device of claim 15, wherein the adhesion layer comprises titanium nitride.

20. The device of claim 15, wherein the at least one of the one or more tantalum nitride layers is doped with carbon.

* * * * *